(12) United States Patent
Shino et al.

(10) Patent No.: US 11,977,135 B2
(45) Date of Patent: May 7, 2024

(54) MAGNETIC SENSOR AND MAGNETIC SENSOR MANUFACTURING METHOD

(71) Applicant: SHOWA DENKO K.K., Tokyo (JP)

(72) Inventors: Tatsunori Shino, Ichihara (JP); Daizo Endo, Ichihara (JP)

(73) Assignee: Resonac Corporation, Tokyo (JP)

( * ) Notice: Subject to any disclaimer, the term of this patent is extended or adjusted under 35 U.S.C. 154(b) by 203 days.

(21) Appl. No.: 17/312,444

(22) PCT Filed: Oct. 21, 2019

(86) PCT No.: PCT/JP2019/041359
§ 371 (c)(1),
(2) Date: Jun. 10, 2021

(87) PCT Pub. No.: WO2020/137119
PCT Pub. Date: Jul. 2, 2020

(65) Prior Publication Data
US 2022/0018911 A1    Jan. 20, 2022

(30) Foreign Application Priority Data
Dec. 27, 2018   (JP) .................... 2018-245501

(51) Int. Cl.
*G01R 33/06* (2006.01)

(52) U.S. Cl.
CPC ................... *G01R 33/063* (2013.01)

(58) Field of Classification Search
CPC ...... G01R 33/063; G01R 33/06; G01R 33/00; G01R 33/0011; G01R 33/02; G01R 33/09;
(Continued)

(56) References Cited

U.S. PATENT DOCUMENTS

2007/0111035 A1*  5/2007  Shimizu .................. G11B 5/667
                                                          428/828.1
2010/0007343 A1   1/2010  Mao et al.
(Continued)

FOREIGN PATENT DOCUMENTS

DE     10308640 A1 *  9/2004  ............. B82Y 25/00
JP     2000-193728 A   7/2000
(Continued)

OTHER PUBLICATIONS

International Search Report for PCT/JP2019/041359 dated Dec. 17, 2019 (PCT/ISA/210).

*Primary Examiner* — Son T Le
(74) *Attorney, Agent, or Firm* — Sughrue Mion, PLLC (57) ABSTRACT

A magnetic sensor (1) includes: a nonmagnetic substrate (10); and a sensitive element (31) including a plurality of soft magnetic layers (105) (lower soft magnetic layer (105a) and upper soft magnetic layer (105b)) laminated on or above the substrate (10) and a conductor layer (106) laminated between the plurality of soft magnetic layers (105) and having higher conductivity than the plurality of soft magnetic layers (105). The sensitive element (31) has a longitudinal direction and a transverse direction and has uniaxial magnetic anisotropy in a direction intersecting the longitudinal direction. The sensitive element (31) is configured to sense a magnetic field by a magnetic impedance effect.

5 Claims, 7 Drawing Sheets

(58) Field of Classification Search
CPC .... G01R 33/091; G01R 33/093; G01D 5/245; H01L 43/00; G01P 3/488
See application file for complete search history.

(56) References Cited

U.S. PATENT DOCUMENTS

| | | | |
|---|---|---|---|
| 2010/0045285 | A1 | 2/2010 | Ohmori et al. |
| 2010/0173173 | A1 | 7/2010 | Katou |
| 2017/0276739 | A1* | 9/2017 | Obana .................... G01C 21/08 |
| 2021/0141035 | A1 | 5/2021 | Endo |

FOREIGN PATENT DOCUMENTS

| | | |
|---|---|---|
| JP | 2002-176210 A | 6/2002 |
| JP | 2002-207069 A | 7/2002 |
| JP | 2003-035757 A | 2/2003 |
| JP | 2008-197089 A | 8/2008 |
| JP | 2008-249406 A | 10/2008 |
| WO | 2008/146610 A1 | 12/2008 |
| WO | 2018/230116 A1 | 12/2018 |

* cited by examiner

MAGNETIC SENSOR AND MAGNETIC SENSOR MANUFACTURING METHOD

CROSS REFERENCE TO RELATED APPLICATIONS

This application is a National Stage of International Application No. PCT/JP2019/041359 filed Oct. 21, 2019, claiming priority based on Japanese Patent Application No. 2018-245501 filed Dec. 27, 2018.

TECHNICAL FIELD

The present invention relates to a magnetic sensor and a magnetic sensor manufacturing method.

BACKGROUND ART

Some publications in this field disclose a magnetic impedance effect element including: a thin-film magnet composed of a hard magnetic film formed on a nonmagnetic substrate; an insulating layer covering the thin-film magnet; and a magneto-sensitive part composed of one or more rectangular soft magnetic films formed on the insulating layer and imparted with uniaxial anisotropy (see Patent Document 1).

CITATION LIST

Patent Literature

Patent Document 1: Japanese Patent Application Laid-Open Publication No. 2008-249406

SUMMARY OF INVENTION

Technical Problem

A magnetic sensor including a sensitive element that senses a magnetic field by a magnetic impedance effect may have a decrease in sensitivity in cases where electric current supplied to the sensitive element is in a high-frequency region. For example, such a magnetic sensor including a sensitive element that senses a magnetic field by a magnetic impedance effect may have a lengthened sensitive element or an increased number of sensitive elements in order to increase its sensitivity. However, lengthening the sensitive element or increasing the number of sensitive elements does increase sensitivity in a low-frequency region, but it may reduce sensitivity in a high-frequency region and result in a failure to achieve desired sensitivity.

An object of the present invention is to avoid a decrease in sensitivity of the magnetic sensor that uses a magnetic impedance effect, in cases where supplied electric current is in a high-frequency region.

Solution to Problem

An aspect of the present invention is a magnetic sensor including: a nonmagnetic substrate; and a sensitive element including a plurality of soft magnetic layers laminated on or above the substrate and a conductor layer laminated between the plurality of soft magnetic layers, the conductor layer having higher conductivity than the plurality of soft magnetic layers, the sensitive element having a longitudinal direction and a transverse direction and having uniaxial magnetic anisotropy in a direction intersecting the longitudinal direction, the sensitive element being configured to sense a magnetic field by a magnetic impedance effect.

Each of the plurality of soft magnetic layers included in the sensitive element may have an antiferromagnetically coupled structure that is provided by a demagnetizing field suppressing layer composed of Ru or an Ru alloy.

The sensitive element may include a plurality of the conductor layers.

The magnetic sensor may further include a thin-film magnet laminated between the substrate and the plurality of soft magnetic layers of the sensitive element, the thin-film magnet being composed of a hard magnetic material and having magnetic anisotropy in an in-plane direction thereof. The longitudinal direction of the sensitive element may be oriented in a direction of a magnetic field generated by the thin-film magnet.

The magnetic sensor may further include a pair of yokes laminated on or above the thin-film magnet such that the pair of yokes face respective ends in the longitudinal direction of the sensitive element, the pair of yokes being configured to induce magnetic flux generated by the thin-film magnet such that the magnetic flux passes through the sensitive element in the longitudinal direction. Each of the pair of yokes may include the plurality of soft magnetic layers and the conductor layer laminated between the plurality of soft magnetic layers.

Another aspect of the present invention is a method for manufacturing a magnetic sensor, the method including: forming, on or above a nonmagnetic substrate, a thin-film magnet composed of a hard magnetic material containing Co, the thin-film magnet having magnetic anisotropy controlled in an in-plane direction thereof; and forming a sensitive element by alternately laminating a plurality of soft magnetic layers and a conductor layer on or above the substrate, the conductor layer having higher conductivity than the plurality of soft magnetic layers, the sensitive element having uniaxial magnetic anisotropy in a direction intersecting a direction in which magnetic flux generated by the thin-film magnet passes.

Advantageous Effects of Invention

The present invention avoids a decrease in sensitivity of the magnetic sensor that uses a magnetic impedance effect, in cases where supplied electric current is in a high-frequency region.

DESCRIPTION OF EMBODIMENTS

Below a detailed description will be given of exemplary embodiments of the present invention with reference to the attached drawings.

First Embodiment (Configuration of the Magnetic Sensor 1)

Figure 1A:
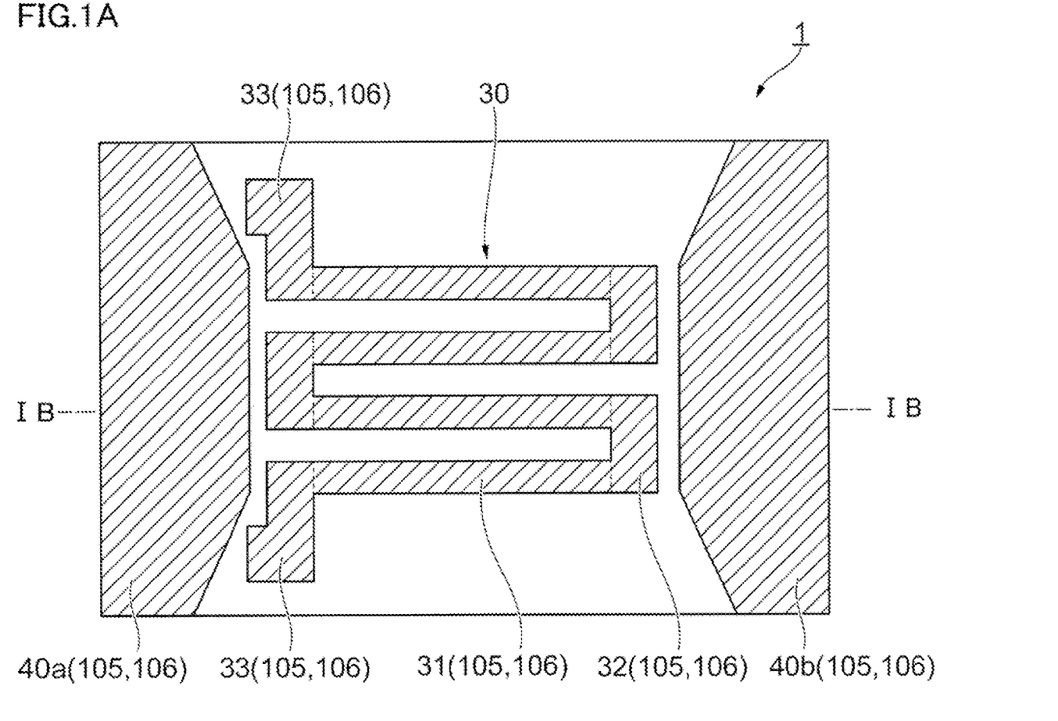
FIGS. 1A and 1B illustrate an example of a magnetic sensor in accordance with a first embodiment.
Figure 1B:
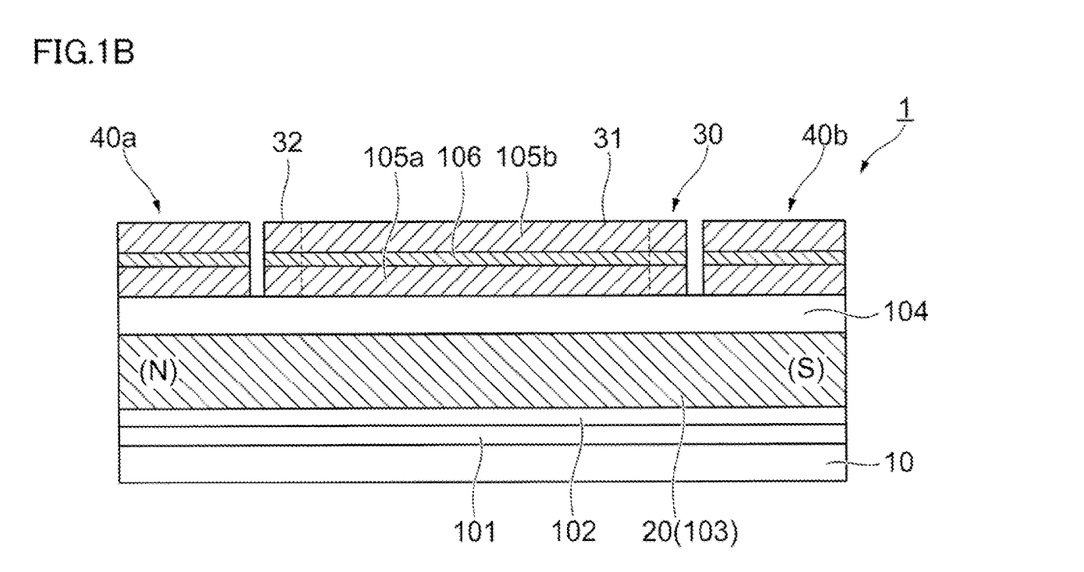

FIGS. 1A and 1B illustrate an example of the magnetic sensor 1 in accordance with a first embodiment; FIG. 1A is a plan view, and FIG. 1B is a sectional view taken along a line IB-IB in FIG. 1A.

As shown in FIG. 1B, the magnetic sensor 1 of the first embodiment includes: a nonmagnetic substrate 10; a thin-film magnet 20 disposed on the substrate 10 and composed of a hard magnetic material (hard magnetic layer 103); and a sensitive part 30 laminated so as to face the thin-film magnet 20 and configured to sense a magnetic field. The sensitive part 30 is composed of a soft magnetic material (lower soft magnetic layer 105a and upper soft magnetic layer 105b) and a conductor (conductor layer 106) with higher conductivity than these soft magnetic layers 105. In the following description, the two soft magnetic layers (lower soft magnetic layer 105a and upper soft magnetic layer 105b) are simply referred to as soft magnetic layers 105 unless their distinction is particularly needed.

A cross-sectional structure of the magnetic sensor 1 will be detailed later.

The hard magnetic material refers to a so-called high coercivity material that, once being magnetized by an external magnetic field, keeps its magnetized state even after removal of the external magnetic field. The soft magnetic material refers to a so-called low coercivity material that is easily magnetizable by an external magnetic field but quickly returns to a non-magnetized or low magnetized state after removal of the external magnetic field.

In the present specification, elements constituting the magnetic sensor 1 (e.g., thin-film magnet 20) is denoted by two-digit reference numerals, and layers processed into these elements (e.g., hard magnetic layer 103) are denoted by reference numerals in the 100s. And the reference numeral for each layer processed into a corresponding element is placed in parentheses following the reference numeral for the corresponding element. For example, the thin-film magnet 20 is denoted like "the thin-film magnet 20 (hard magnetic layer 103)". In the figures, the reference numerals are presented like "20(103)". This holds for other elements.

A description will be given of a planar structure of the magnetic sensor 1, with reference to FIG. 1A. By way of example, the magnetic sensor 1 has a rectangular planar shape. Here, a description will be given of the sensitive part 30 and yokes 40 formed in the uppermost part of the magnetic sensor 1. The sensitive part 30 includes: a plurality of sensitive elements 31 each being of a long strip shape having longitudinal and transverse directions; connecting portions 32 connecting each adjacent sensitive elements 31 in series in a zigzag form; and terminal portions 33 connected with electric wires for electric current supply. In the shown example, four sensitive elements 31 are arranged such that their longitudinal directions are parallel to each other. In the magnetic sensor 1 of the present embodiment, the sensitive elements 31 are magnetic impedance effect elements.

By way of example, each sensitive element 31 has a longitudinal length of about 1 mm, a transverse width of about several hundreds of micrometers, and a thickness (total thickness of the soft magnetic layers 105 and the conductor layer 106) of 0.5 µm to 5 µm. A distance between two sensitive elements 31 is 50 µm to 150 µm.

The connecting portions 32 are disposed between ends of each adjacent sensitive elements 31 to connect each adjacent sensitive elements 31 in series in a zigzag form. As the magnetic sensor 1 shown in FIG. 1A includes four sensitive elements 31 arranged in parallel to each other, there are three connecting portions 32. The number of the sensitive elements 31 is set as a function of the magnitude of the magnetic field to be sensed (measured), for example. Accordingly, in the case where there are two sensitive elements 31, there will be one connecting portion 32. In the case where there is one sensitive element 31, there will be no connecting portion 32. The width of the connecting portion 32 may be set as a function of electric current to be supplied to the sensitive part 30. By way of example, the connecting portion 32 may have the same width as that of the sensitive element 31.

The terminal portions 33 are provided to two respective ends of the sensitive elements 31 that are not connected with the connecting portions 32. Each terminal portion 33 includes a lead-out portion led out from the sensitive element 31 and pad portions to be connected with electric wires for electric current supply. The lead-out portion is provided to arrange the two pad portions in the transverse direction of the sensitive element 31. The pad portions may be arranged continuous to the sensitive element 31 without the lead-out portion. The pad portions may have a size that allows for connection of electric wires. Since there are four sensitive elements 31, the two terminal portions 33 are arranged on the left side in FIG. 1A. In the case where the sensitive elements 31 are odd in number, the two terminal portions 33 may be arranged respectively on the right and left sides.

The sensitive elements 31, the connecting portions 32, and the terminal portions 33 of the sensitive part 30 are integrally formed of the two soft magnetic layers 105 (lower soft magnetic layer 105a and upper soft magnetic layer 105b) and the conductor layer 106. As the soft magnetic layers 105 and the conductor layer 106 are conductive, electric current can be supplied from one terminal portion 33 to the other terminal portion 33.

Note that the length and width of each sensitive element 31 and the number of sensitive elements 31 arranged in parallel described above are merely exemplary, and these parameters may be modified according to factors such the value of the magnetic field to be sensed (measured) and the soft magnetic material to be used.

The magnetic sensor 1 further includes the yokes 40 facing longitudinal ends of the sensitive elements 31. In this example, the magnetic sensor 1 includes two yokes 40a, 40b facing respective longitudinal ends of each sensitive element 31. Hereinafter, the yokes 40a, 40b may be simply referred to as the yokes 40 unless their distinction is particularly needed. The yokes 40 induce magnetic lines of force to the longitudinal ends of the sensitive elements 31. Hence, the yokes 40 include a soft magnetic material (soft magnetic layer 105) that easily transmits magnetic lines of force. In this example, the sensitive part 30 and the yokes 40 are composed of the two soft magnetic layers 105 (lower soft magnetic layer 105a and upper soft magnetic layer 105b) and the conductor layer 106. It should be noted that the yokes 40 may be eliminated when magnetic lines of force can sufficiently pass through the sensitive elements 31 in the longitudinal direction thereof.

The magnetic sensor 1 is several millimeters square in planar shape. It should be noted that the size of the magnetic sensor 1 is not limited to this value.

Now a description will be given of a sectional structure of the magnetic sensor 1, with reference to FIG. 1B. The magnetic sensor 1 is composed of the nonmagnetic substrate 10, and an adhesive layer 101, a control layer 102, the hard magnetic layer 103 (thin-film magnet 20), an insulating layer 104, and the sensitive part 30 and the yokes 40, each of which is composed of the soft magnetic layers 105 and the conductor layer 106, laminated in this order on the substrate 10.

The substrate 10 is made of a nonmagnetic material. Example of the substrate 10 includes an oxide substrate such as glass and sapphire, a semiconductor substrate such as silicon, and a metal substrate such as aluminum, stainless steel, and metal plated with nickel phosphorus.

The adhesive layer 101 increases adhesiveness of the control layer 102 to the substrate 10. As the adhesive layer 101, use may be made of an alloy containing Cr or Ni. Examples of the alloy containing Cr or Ni include CrTi, CrTa, and NiTa. The adhesive layer 101 is 5 nm to 50 nm thick, for example. It should be noted that the adhesive layer 101 may be eliminated when the control layer 102 has sufficient adhesiveness to the substrate 10. It should be noted that in the present specification, the composition ratio of the alloy containing Cr or Ni will not be presented. This holds for other alloys given below.

The control layer 102 controls the magnetic anisotropy of the thin-film magnet 20, which is composed of the hard magnetic layer 103, such that the magnetic anisotropy develops in an in-plane direction of the film. As the control layer 102, use may be made of Cr, Mo, W, or an alloy containing at least one of these metals (hereinafter referred to as an alloy containing Cr or the like constituting the control layer 102). Examples of the alloy containing Cr or the like constituting the control layer 102 include CrTi, CrMo, CrV, and CrW. The control layer 102 is 10 nm to 300 nm thick, for example.

As the hard magnetic layer 103 constituting the thin-film magnet 20, use may be made of an alloy that contains Co as a main component and one or both of Cr and Pt (hereinafter referred to as a Co alloy constituting the thin-film magnet 20). Examples of the Co alloy constituting the thin-film magnet 20 include CoCrPt, CoCrTa, CoNiCr, and CoCrPtB. The Co alloy constituting the thin-film magnet 20 may also contain Fe. The hard magnetic layer 103 is 1 μm to 3 μm thick, for example.

The alloy containing Cr or the like constituting the control layer 102 has a body-centered cubic (bcc) structure. Thus, the hard magnetic material (hard magnetic layer 103) constituting the thin-film magnet 20 preferably has a hexagonal close-packed (hcp) structure, which allows crystal growth to easily take place on the control layer 102 composed of the alloy containing Cr or the like with the bcc structure. Such crystal growth of the hard magnetic layer 103 with the hcp structure on the bcc structure can easily cause a c-axis of the hcp structure to be oriented in the in-plane direction. Consequently, the thin-film magnet 20, which is composed of the hard magnetic layer 103, can easily have the magnetic anisotropy in the in-plane direction. The hard magnetic layer 103 is a polycrystal composed of a group of differently oriented crystallites, and each crystallite has the magnetic anisotropy in the in-plane direction. This magnetic anisotropy is derived from magneto-crystalline anisotropy.

To facilitate the crystal growth of the alloy containing Cr or the like constituting the control layer 102 and the Co alloy constituting the thin-film magnet 20, the substrate 10 may be heated to 100° C. to 600° C. This heating facilitates the crystal growth of the alloy containing Cr or the like constituting the control layer 102 and thus facilitates the crystal orientation that yields an easy axis of magnetization in the plane of the hard magnetic layer 103 with the hcp structure. In other words, the heating facilitates impartation of the in-plane magnetic anisotropy to the hard magnetic layer 103.

The insulating layer 104 is composed of a nonmagnetic conductor and provides electrical insulation between the thin-film magnet 20 and the sensitive part 30. Examples of the conductor constituting the insulating layer 104 include oxides such as $SiO_2$, $Al_2O_3$ and $TiO_2$ and nitrides such as $Si_3N_4$ and AlN. The insulating layer 104 is 0.1 μm to 30 μm thick, for example.

Each sensitive element 31 of the sensitive part 30 is imparted with uniaxial magnetic anisotropy in a direction intersecting the longitudinal direction, e.g., in the transverse direction (width direction) perpendicular to the longitudinal direction. It should be noted that the direction intersecting the longitudinal direction may be a direction at an angle of 45 degrees or more with respect to the longitudinal direction.

As the soft magnetic material (lower soft magnetic layer 105a and upper soft magnetic layer 105b) constituting the sensitive element 31, use may be made of an amorphous alloy that contains Co as a main component and is doped with high melting point metal such as Nb, Ta, and W (hereinafter referred to as a Co alloy constituting the sensitive element 31). Examples of the Co alloy constituting the sensitive element 31 include CoNbZr, CoFeTa, and CoWZr. Each soft magnetic material (lower soft magnetic layer 105a and upper soft magnetic layer 105b) constituting the sensitive element 31 is 0.2 μm to 2 μm thick, for example. While in the example shown in FIG. 1B, the lower soft magnetic layer 105a and the upper soft magnetic layer 105b have the same thickness, they may have different thickness.

As the conductor (conductor layer 106) constituting the sensitive element 31, use is preferably made of a highly conductive metal or alloy, more preferably a highly conductive and nonmagnetic metal or alloy. Specifically, as the conductor (conductor layer 106) constituting the sensitive element 31, use may be made of metal such as aluminum, copper, and silver. The conductor (conductor layer 106) constituting the sensitive element 31 is 10 nm to 500 nm thick, for example. In order to achieve a desired value of resistance R of the sensitive element 31 (described later) and a desired value of the magnetic field to be sensed, the thickness of the conductor (conductor layer 106) constituting the sensitive element 31 may be modified depending on the kind of the Co alloy constituting the sensitive element 31 used as the soft magnetic layers 105 and the kind of the conductor used as the conductor layer 106.

The adhesive layer 101, the control layer 102, the hard magnetic layer 103, and the insulating layer 104 are processed to have a rectangular planar shape (see FIG. 1A). Two opposing exposed sides of the thin-film magnet 20 are the north pole ((N) in FIG. 1B) and the south pole ((S) in FIG. 1B). A line connecting the north pole and the south pole of the thin-film magnet 20 is oriented in the longitudinal direction of the sensitive element 31 of the sensitive part 30. The phrase "oriented in the longitudinal direction" means that the line connecting the north pole and the south pole is angled 45 degrees or less with respect to the longitudinal direction. A smaller angle between the line connecting the north and south poles and the longitudinal direction is preferable.

In the magnetic sensor 1, magnetic lines of force emanating from the north pole of the thin-film magnet 20 once go outside of the magnetic sensor 1. Then, some of the magnetic lines of force pass through the sensitive elements 31 via the yoke 40a and go outside of the magnetic sensor 1 again via the yoke 40b. Thus, the magnetic lines of force having passed the sensitive elements 31 return to the south pole of the thin-film magnet 20 together with other magnetic lines of force that have not passed the sensitive elements 31. In other words, the thin-film magnet 20 applies a magnetic field in the longitudinal direction of the sensitive elements 31.

The north and south poles of the thin-film magnet 20 are hereinafter collectively referred to as "both magnetic poles", and each of the north and south poles is hereinafter referred to as a "magnetic pole" unless their distinction is particularly needed.

As shown in FIG. 1A, when viewed from the top side of the substrate 10, each of the yokes 40 (yokes 40a, 40b) has a shape that is tapered as it approaches the sensitive part 30. This shape makes it possible to concentrate the magnetic field (gather the magnetic lines of force) on the sensitive part 30. In other words, this shape helps further increase the sensitivity by enhancing the magnetic field at the sensitive part 30. It should be noted that the yokes 40 (yokes 40a, 40b) are not necessarily tapered on the portions thereof facing the sensitive part 30.

A distance between each of the yokes 40 (yokes 40a, 40b) and the sensitive part 30 may be 1 μm to 100 μm, for example.

(Functions of the Magnetic Sensor 1)

Figure 2:
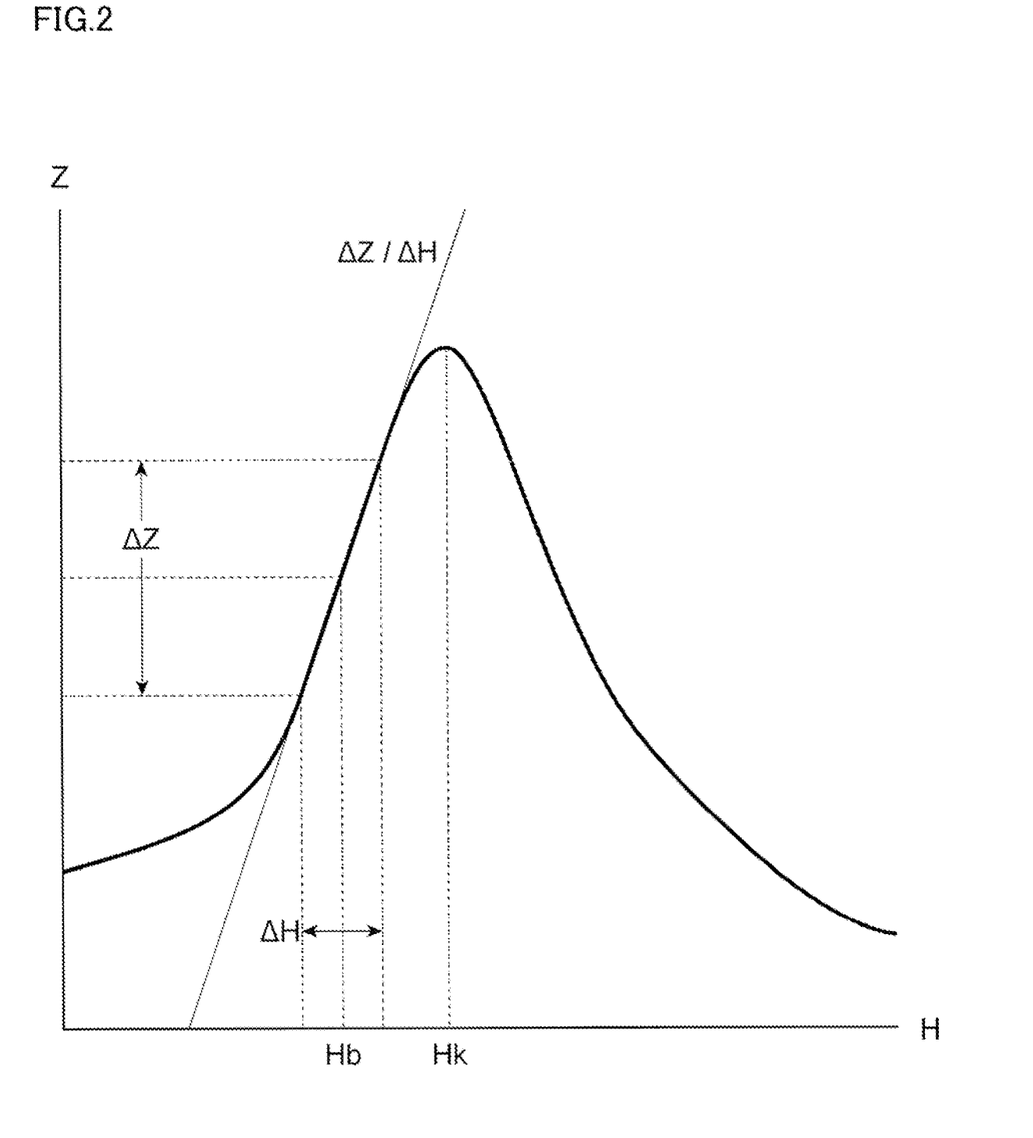
FIG. 2 illustrates a relationship between a magnetic field applied in a longitudinal direction of sensitive elements of a sensitive part of the magnetic sensor and impedance of the sensitive part.

Now a description will be given of functions of the magnetic sensor 1. FIG. 2 illustrates a relationship between the magnetic field applied in the longitudinal direction of the sensitive elements 31 of the sensitive part 30 of the magnetic sensor 1 and impedance of the sensitive part 30. In FIG. 2, the horizontal axis represents the magnetic field H, and the vertical axis represents the impedance Z. The impedance Z of the sensitive part 30 is measured by applying high-frequency electric current between the two terminal portions 33.

As shown in FIG. 2, the impedance Z of the sensitive part 30 increases with increase in the magnetic field H applied in the longitudinal direction of the sensitive elements 31. However, by use of a portion where an amount of change ΔZ of the impedance Z is steep as a function of an amount of change ΔH of the magnetic field H (i.e., a portion where ΔZ/ΔH is large) within the region where the applied magnetic field H is smaller than the anisotropic magnetic field Hk of the sensitive elements 31, a slight change of the magnetic field H can be extracted as the amount of change ΔZ of the impedance Z. In FIG. 2, the center of the portion of the magnetic field H where the ΔZ/ΔH is large is denoted as a magnetic field Hb. That is, the amount of change of the magnetic field H (ΔH) near the magnetic field Hb (in the region shown by the arrows in FIG. 2) can be measured with high accuracy. The magnetic field Hb may also be called a bias magnetic field.

By the way, a conventional magnetic sensor including a sensitive element composed of a single soft magnetic layer as a magnetic impedance effect element may have a reduced amount of change ΔZ of impedance Z as a function of an amount of change ΔH of the magnetic field H (ΔZ/ΔH) when supplied electric current has a high frequency. In other words, a conventional magnetic sensor may have a reduced sensitivity to a change in the magnetic field H when supplied electric current has a high frequency.

Figure 3:
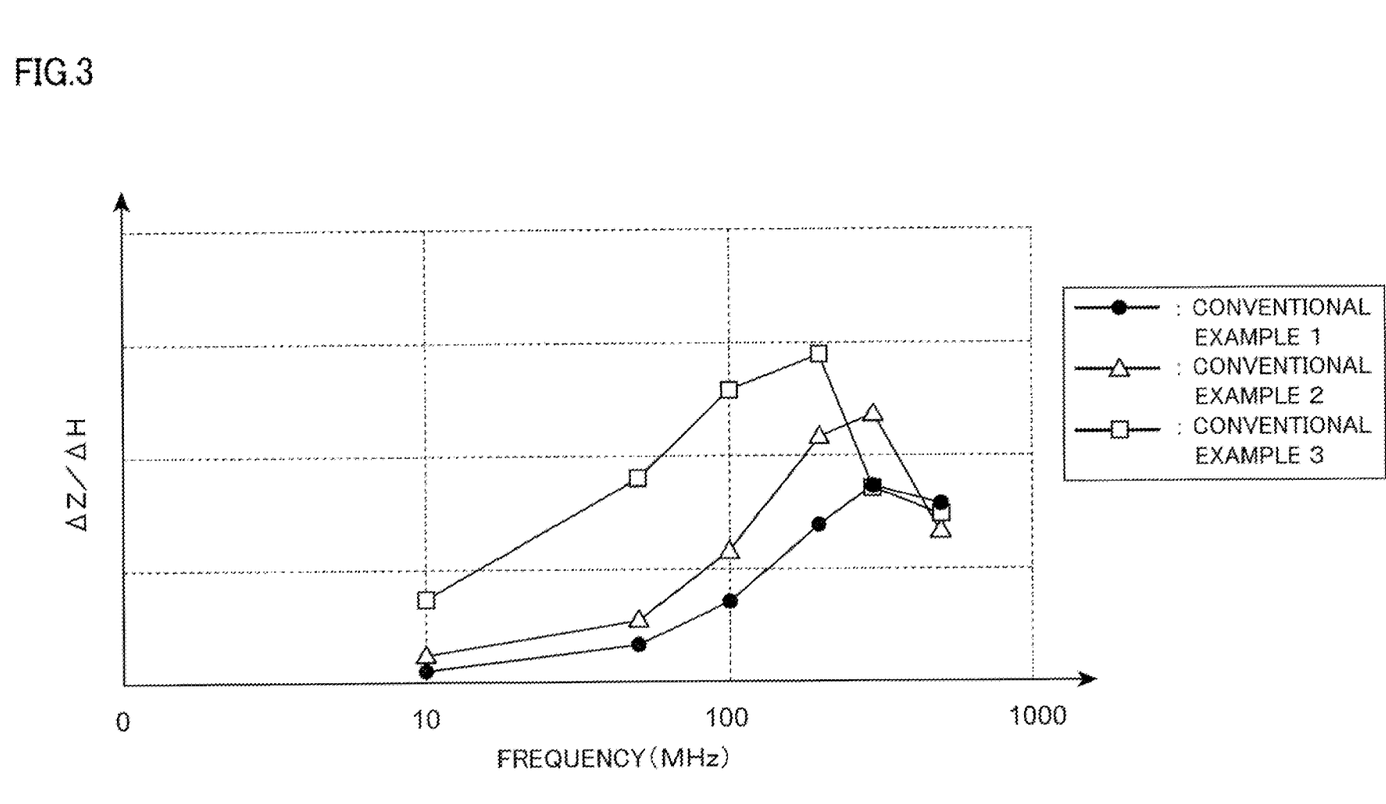
FIG. 3 illustrates a relationship between a frequency of supplied electric current and an amount of change $\Delta Z$ of impedance Z as a function of an amount of change $\Delta H$ of a magnetic field H ($\Delta Z/\Delta H$) regarding conventional magnetic sensors composed of a single soft magnetic layer.

FIG. 3 illustrates a relationship between a frequency of supplied electric current and an amount of change ΔZ of the impedance Z as a function of an amount of change ΔH of the magnetic field H (ΔZ/ΔH) regarding conventional magnetic sensors 1 composed of a single soft magnetic layer 105 (i.e., not including the conductor layer 106 shown in FIG. 1B). Hereinafter, components of the conventional magnetic sensors 1 similar to those of the magnetic sensor 1 of the present embodiment shown in FIGS. 1A and 1B will be described using the same reference numerals.

FIG. 3 illustrates a relationship between a frequency of supplied electric current and an amount of change ΔZ of the impedance Z as a function of an amount of change ΔH of the magnetic field H (ΔZ/ΔH) regarding three kinds of magnetic sensors with a different longitudinal length (hereinafter simply referred to as "length") of the sensitive element 31 and a different number of sensitive elements 31 arranged in parallel.

Specifically, Conventional Example 1 (twelve sensitive elements of 1 mm) in FIG. 3 is a graph about a magnetic sensor 1 including twelve parallelly arranged sensitive elements 31 each with the length of 1 mm. Conventional Example 2 (thirty sensitive elements of 1 mm) in FIG. 3 is a graph about a magnetic sensor 1 including thirty parallelly arranged sensitive elements 31 each with the length of 1 mm. Conventional Example 3 (thirty sensitive elements of 2 mm) in FIG. 3 is a graph about a magnetic sensor 1 including thirty parallelly arranged sensitive elements 31 each with the length of 2 mm. Each sensitive element 31 included in the magnetic sensors 1 of Conventional Examples 1 to 3 is made of $Co_{85}Nb_{12}Zr_3$ and 20 μm wide and 1.5 μm thick. The magnetic sensors 1 of Conventional Examples 1 to 3 have the same configuration except for the length of each sensitive element 31 and the number of sensitive elements 31 arranged in parallel.

As shown in FIG. 3, in the conventional magnetic sensors 1 composed of a single soft magnetic layer 105 (i.e., not including the conductor layer 106 shown in FIG. 1B), the amount of change ΔZ of the impedance Z as a function of the amount of change ΔH of the magnetic field H (ΔZ/ΔH) increases with increase in frequency when electric current supplied to the sensitive elements 31 has a low frequency (e.g., less than 100 MHz); however, the sensitivity of these magnetic sensors 1 tends to decrease when electric current supplied to the sensitive elements 31 has a high frequency (e.g., 100 MHz or more). This tendency is more prominent with increase in length of each sensitive element 31 or increase in the number of sensitive elements 31 arranged in parallel, as in Conventional Examples 2 and 3 in FIG. 3.

Such a decrease in sensitivity of the magnetic sensor 1 in the case of supplying a high-frequency electric current is considered to be due to stray capacitance generated in gaps between the sensitive elements 31 arranged in parallel and gaps between each sensitive element 31 (sensitive part 30) and the yokes 40. More specifically, such a decrease is considered to be due to imaginary capacitive components (capacitive reactance) becoming large in the impedance Z of the magnetic sensor 1.

Increasing the length of each sensitive element 31 and/or increasing the number of sensitive elements 31 arranged in parallel in the magnetic sensor 1 leads to a larger number of gaps between the sensitive elements 31 and between each sensitive element 31 (sensitive part 30) and the yokes 40, which in turn leads to greater influence of the stray capacitance. This is considered to be a cause of the remarkable decrease in the sensitivity of the magnetic sensor 1.

Here, assuming that the resistance of the sensitive element 31 of the magnetic sensor 1 is R, the stray capacitance of the sensitive element 31 is C, and the sensitive element 31 is a parallel circuit of the resistance R and the stray capacitance C, a relaxation frequency $f_0$ of the magnetic sensor 1 can be expressed by the following expression (1). The relaxation frequency $f_0$ is a frequency at which a real part (resistance) of the impedance Z attenuates and an imaginary part (reactance) thereof takes a minimum value, corresponding to a frequency at which the sensitivity of the sensitive element 31 starts to decrease.

$$f_0 = 1/2\pi RDC \quad (1)$$

From the expression (1), it is necessary to reduce the resistance R or the stray capacitance C of the sensitive element 31 in order to increase the sensitivity of the magnetic sensor 1 in a high-frequency region, i.e., to increase the relaxation frequency $f_0$.

In contrast, the sensitive element 31 of the magnetic sensor 1 of the present embodiment is composed of a lamination of the soft magnetic layers 105 and the conductor layer 106 with higher conductivity than the soft magnetic layers 105. This reduces the resistance R of the sensitive element 31 and thus improves the sensitivity of the magnetic sensor 1 in a high-frequency region, as compared to when the sensitive element 31 does not include the conductor layer 106.

Figure 4:
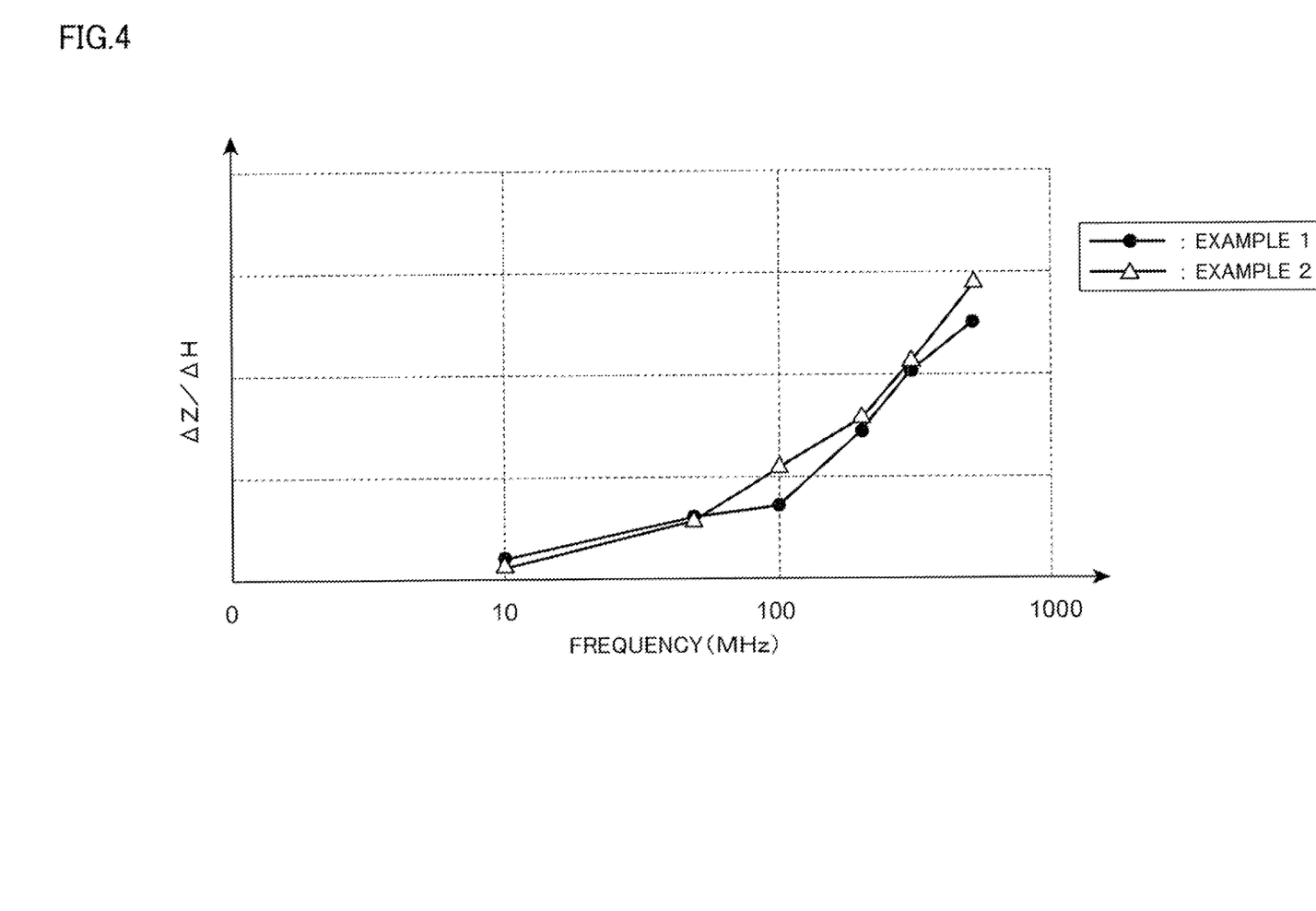
FIG. 4 explains functions of the magnetic sensor of the present embodiment, illustrating a relationship between a frequency of supplied electric current and an amount of change $\Delta Z$ of impedance Z as a function of an amount of change $\Delta H$ of a magnetic field H ($\Delta Z/\Delta H$) regarding the magnetic sensor of the present embodiment.

FIG. 4 explains functions of the magnetic sensor 1 of the present embodiment, illustrating a relationship between a frequency of supplied electric current and the amount of change ΔZ of the impedance Z as a function of the amount of change ΔH of the magnetic field H (ΔZ/ΔH) regarding the magnetic sensor 1 of the present embodiment.

The magnetic sensor 1 of each of Example 1 and Example 2 of the present embodiment in FIG. 4, which show a relationship between a frequency of supplied electric current and the amount of change ΔZ of the impedance Z as a function of the amount of change ΔH of the magnetic field H (ΔZ/ΔH), has a similar configuration to that of the magnetic sensor 1 of Conventional Example 1 described above, except that the sensitive part 30 (sensitive element 31) in the present embodiment includes the conductor layer 106.

Specifically, in the magnetic sensor 1 of Example 1, the sensitive part 30 (sensitive element 31) is composed of a lamination of the lower soft magnetic layer 105a and the upper soft magnetic layer 105b each being made of $Co_{85}Nb_{12}Zr_3$ and 0.75 μm thick and the conductor layer 106 interposed between the soft magnetic layers 105 and being made of aluminum and 100 nm thick. In the magnetic sensor 1 of Example 2, the sensitive part 30 (sensitive element 31) is composed of a lamination of the lower soft magnetic layer 105a and the upper soft magnetic layer 105b each being made of $Co_{85}Nb_{12}Zr_3$ and 0.5 μm thick and the conductor layer 106 interposed between the soft magnetic layers 105 and being made of aluminum and 100 nm thick.

Here, $Co_{85}Nb_{12}Zr_3$, which is an example of the soft magnetic layer 105 (Co alloy constituting the sensitive element 31), has an electrical resistivity of about 250 μΩ·cm, and aluminum, which is an example of the conductor layer 106 (conductor constituting the sensitive element 31), has an electrical resistivity of about 2.5 μΩ·cm.

Thus, by virtue of the sensitive part 30 (sensitive element 31) including the conductor layer 106 being made of aluminum and 100 nm thick, the magnetic sensor 1 of the present embodiment shown in Examples 1 and 2 can have the resistance R of the sensitive element 31 reduced to about 1/10, as compared to that of the magnetic sensor 1 of Conventional Example 1 without the conductor layer 106.

As a result, the magnetic sensor 1 of the present embodiment has an increased relaxation frequency $f_0$ as expressed by the expression (1) and, as shown in FIG. 4, avoids a decrease in the amount of change ΔZ of the impedance Z as a function of the amount of change ΔH of the magnetic field H (ΔZ/ΔH) even when electric current supplied to the sensitive element 31 has a high frequency (e.g., 100 MHz or more). In other words, the magnetic sensor 1 of the present embodiment avoids a decrease in sensitivity even when electric current supplied to the sensitive element 31 has a high frequency (e.g., 100 MHz or more).

Additionally, as a result of the reduced resistance R, which is due to the sensitive element 31 including the conductor layer 106, the magnetic sensor 1 of the present embodiment has an increased real part (resistance) and increased imaginary part (reactance) of the impedance Z in the high-frequency region as compared to the case where the sensitive element 31 does not include the conductor layer 106, though not shown in figures. Hence, the magnetic sensor 1 of the present embodiment can further increase the skin effect when high-frequency electric current is supplied.

According to the above expression (1), reducing the stray capacitance C of the sensitive element 31, as well as reducing the resistance R of the sensitive element 31, can also increase the relaxation frequency $f_0$ and improve the sensitivity of the magnetic sensor 1 in the high-frequency region.

However, reducing the stray capacitance C of the sensitive element 31 requires changing parameters such as a distance between adjacent sensitive elements 31, a distance between the sensitive part 30 and each yoke 40, and the number of sensitive elements 31 arranged in parallel. In other words, a planar shape and other factors of the magnetic sensor 1 need to be greatly changed.

In contrast, the present embodiment can improve the sensitivity of the magnetic sensor 1 in the high-frequency region just by changing the lamination structure of the sensitive element 31, without needing to change the planar shape and other factors of the magnetic sensor 1.

(Method for Manufacturing the Magnetic Sensor 1)

Now a description will be given of an exemplary method for manufacturing the magnetic sensor 1.

FIGS. 5A to 5E illustrate an exemplary method for manufacturing the magnetic sensor 1. FIGS. 5A to 5E depict steps of the method for manufacturing the magnetic sensor 1. It should be noted that the steps shown in FIGS. 5A to 5E are representative in nature and may include other steps. The steps proceed sequentially from FIG. 5A through FIG. 5E. FIGS. 5A to 5E correspond to the sectional view taken along the line IB-IB in FIG. 1A.

As described above, the substrate 10 is a substrate made of a nonmagnetic material, e.g., an oxide substrate such as glass and sapphire, a semiconductor substrate such as silicon, and a metal substrate such as aluminum, stainless steel, and metal plated with nickel phosphorus. The substrate 10 may be formed with linear grooves or linear protrusions and recesses with a curvature radius Ra of e.g., 0.1 nm to 100 nm by means of a polishing machine or the like. The direction of these linear grooves or linear protrusions and recesses may be aligned with the direction connecting the north and south poles of the thin-film magnet 20 composed of the hard magnetic layer 103. This facilitates the crystal growth of the hard magnetic layer 103 in the direction of the grooves. This in turn helps to cause the easy axis of magnetization of the thin-film magnet 20 composed of the hard magnetic layer 103 to be oriented in the direction of the grooves (direction connecting the north and south poles of the thin-film magnet 20). In other words, the thin-film magnet 20 can be magnetized easier.

By way of example, the substrate 10 discussed herein is assumed to be glass that is about 95 mm in diameter and about 0.5 mm thick. In the case where the magnetic sensor 1 is several millimeters square in planar shape, multiple magnetic sensors 1 are manufactured in batch on the substrate 10 and then divided (cut) into individual magnetic sensors 1. While FIGS. 5A to 5E focus on one magnetic sensor 1 depicted at the center of the figures, the figures also depict portions of right and left adjacent magnetic sensors 1. A boundary between two adjacent magnetic sensors 1 is shown by a dash-dotted line in the figures.

Figure 5A:
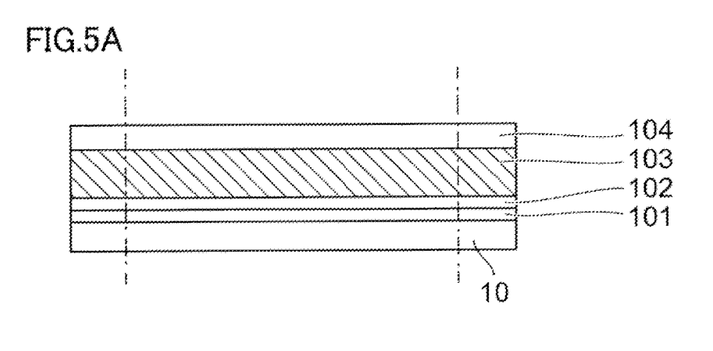
FIGS. 5A to 5E illustrate an exemplary method for manufacturing the magnetic sensor.

As shown in FIG. 5A, after cleaning of the substrate 10, the adhesive layer 101, the control layer 102, the hard magnetic layer 103, and the insulating layer 104 are deposited (stacked) in this order on one side (hereinafter referred to as a "top side") of the substrate 10 to thereby form a laminate.

First, the adhesive layer 101 composed of the alloy containing Cr or Ni, the control layer 102 composed of the alloy containing Cr or the like, and the hard magnetic layer 103 composed of the Co alloy constituting the thin-film magnet 20 are successively deposited (stacked) in this order. This deposition may be done by a sputtering method or the like. The substrate 10 is moved to successively face multiple targets made of respective materials, whereby the adhesive layer 101, the control layer 102, and the hard magnetic layer 103 are laminated in this order on the substrate 10. As described above, the substrate 10 may be heated to e.g., 100° C. to 600° C. during formation of the control layer 102 and the hard magnetic layer 103 to facilitate the crystal growth.

The substrate 10 may or may not be heated during deposition of the adhesive layer 101. The substrate 10 may be heated prior to deposition of the adhesive layer 101 to remove moisture absorbed on the top side of the substrate 10.

Then, the insulating layer 104, which is e.g., an oxide such as $SiO_2$, $Al_2O_3$ and $TiO_2$ or a nitride such as $Si_3N_4$ and AlN, is deposited (stacked). The deposition of the insulating layer 104 may be done by a plasma CVD method, a reactive sputtering method, or the like.

Figure 5B:
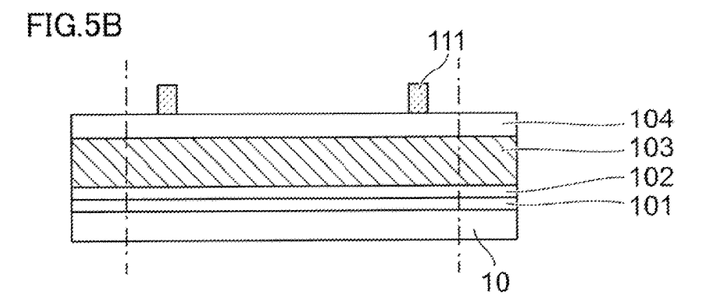

As shown in FIG. 5B, a photoresist pattern (resist pattern) 111 is formed by any known photolithography technique. The resist pattern 111 includes openings at positions where the sensitive part 30 and the yokes 40 (yokes 40a, 40b) are to be formed.

Figure 5C:
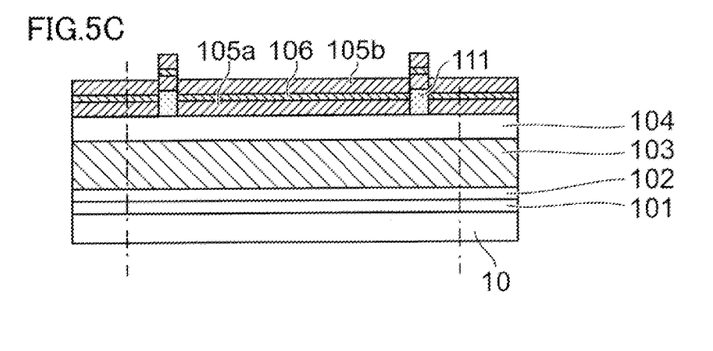

Subsequently, as shown in FIG. 5C, the lower soft magnetic layer 105a composed of the Co alloy constituting the sensitive element 31, the conductor layer 106 composed of the conductor with higher conductivity than the soft magnetic layers 105, and the upper soft magnetic layer 105b composed of the Co alloy constituting the sensitive element 31 are deposited (stacked) in this order. The deposition of the soft magnetic layers 105 (lower soft magnetic layer 105a and upper soft magnetic layer 105b) and the conductor layer 106 may be done by a sputtering method, for example.

Figure 5D:
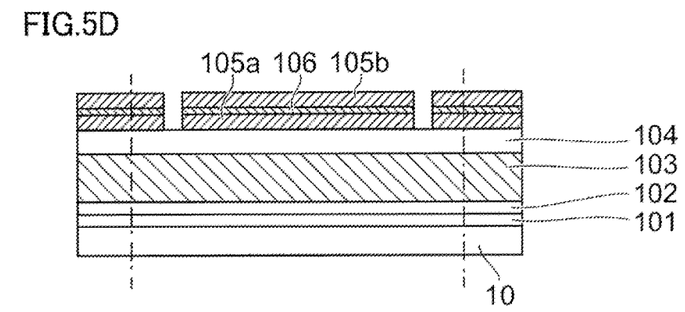

As shown in FIG. 5D, the resist pattern 111 is removed, and also the soft magnetic layers 105 (lower soft magnetic layer 105a and upper soft magnetic layer 105b) and the conductor layer 106 on the resist pattern 111 are removed (lifted off). As a result, the sensitive part 30 and the yokes 40 (yokes 40a, 40b) composed of the soft magnetic layers 105 and the conductor layer 106 are formed. In other words, the sensitive part 30 and the yokes 40 are simultaneously formed by deposition of the soft magnetic layers 105 and the conductor layer 106.

Thereafter, the soft magnetic layers 105 are imparted with uniaxial magnetic anisotropy in the width direction of the sensitive elements 31 of the sensitive part 30. This impartation of the uniaxial magnetic anisotropy to the soft magnetic layers 105 can be done by, for example, heat treatment (heat treatment in a rotating magnetic field) at 400° C. in a rotating magnetic field of 3 kG (0.3T) and subsequent heat treatment (heat treatment in a static magnetic field) at 400° C. in a static magnetic field of 3 kG (0.3T). At this time, similar uniaxial magnetic anisotropy is imparted to the soft magnetic layers 105 constituting the yokes 40. However, the yokes 40 may or may not be imparted with the uniaxial magnetic anisotropy because the yokes 40 are only required to serve as a magnetic circuit.

Then, the hard magnetic layer 103 constituting the thin-film magnet 20 is magnetized. This magnetization of the hard magnetic layer 103 can be done by applying a magnetic field larger than coercive force of the hard magnetic layer 103 in a static magnetic field or a pulsed magnetic field until the magnetization of the hard magnetic layer 103 is saturated.

Figure 5E:
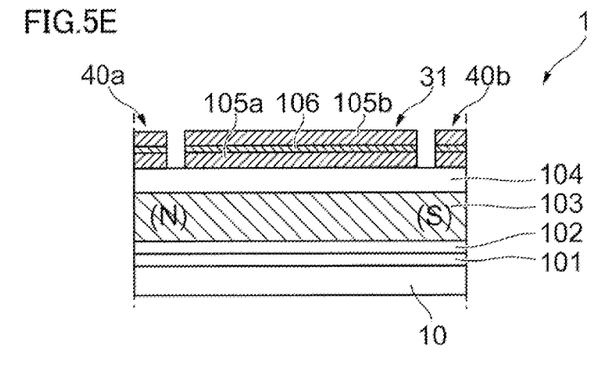

Subsequently, as shown in FIG. 5E, multiple magnetic sensors 1 formed on the substrate 10 are divided (cut) into individual magnetic sensors 1. In other words, the substrate 10, the adhesive layer 101, the control layer 102, the hard magnetic layer 103, the insulating layer 104, the soft magnetic layers 105, and the conductor layer 106 are cut such that each magnetic sensor 1 has a rectangular planar shape as shown in the plan view of FIG. 1A. This results in the magnetic poles (north pole and south pole) of the thin-film magnet 20 being exposed on respective lateral sides of the divided (cut) hard magnetic layer 103. Thus, the magnetized hard magnetic layer 103 becomes the thin-film magnet 20. This division (cutting) can be done by a dicing method, a laser cutting method, or the like.

It should be noted that an etching step of removing the adhesive layer 101, the control layer 102, the hard magnetic layer 103, the insulating layer 104, the soft magnetic layers 105, and the conductor layer 106 between adjacent magnetic sensors 1 on the substrate 10 so as to shape each magnetic sensor 1 into a rectangular planar shape (planar shape of the magnetic sensor 1 shown in FIG. 1A) may take place before the step of dividing the multiple magnetic sensors 1 into individual magnetic sensors 1 shown in FIG. 5E. As such, the exposed substrate 10 may be divided (cut).

Still alternatively, after the step of forming the laminate in FIG. 5A, the adhesive layer 101, the control layer 102, the hard magnetic layer 103, and the insulating layer 104 may be processed so as to shape each magnetic sensor 1 into a rectangular planar shape (planar shape of the magnetic sensor 1 shown in FIG. 1A).

As compared to these methods, the manufacturing method shown in FIGS. 5A to 5E requires simplified steps.

The magnetic sensor 1 is thus manufactured. It should be noted that the impartation of the uniaxial anisotropy to the soft magnetic layers 105 and/or magnetization of the thin-film magnet 20 may be performed for each magnetic sensor 1 or multiple magnetic sensors 1 after the step of dividing the multiple magnetic sensors 1 into individual magnetic sensors 1 shown in FIG. 5E.

Without the control layer 102, it would be necessary to impart the in-plane magnetic anisotropy by heating the hard magnetic layer 103 to 800° C. or more to bring about crystal growth after deposition thereof. In contrast, providing the control layer 102, as in the magnetic sensor 1 of the first embodiment, eliminates the need for bringing about such crystal growth under high temperature of 800° C. or more because the control layer 102 can facilitate the crystal growth.

The impartation of the uniaxial anisotropy to the sensitive elements 31 of the sensitive part 30 may be done by a magnetron sputtering method during stacking of the soft magnetic layers 105 composed of the Co alloy constituting the sensitive element 31, instead of the aforementioned heat treatment in a rotating magnetic field and heat treatment in a static magnetic field. The magnetron sputtering method forms a magnetic field using magnets and confines (concentrates) electrons generated by discharge to a surface of a target. The method thus increases the probability of collisions of the electrons with gas and facilitates ionization of the gas, thereby increasing film stacking speed (film deposition speed). This magnetic field formed by the magnets used in the magnetron sputtering method imparts the uniaxial anisotropy to the soft magnetic layers 105 at the same time as the stacking thereof. As such, the magnetron sputtering method allows the step of imparting the uniaxial anisotropy by the heat treatment in a rotating magnetic field and the heat treatment in a static magnetic field to be omitted.

Second Embodiment

Figure 6A:
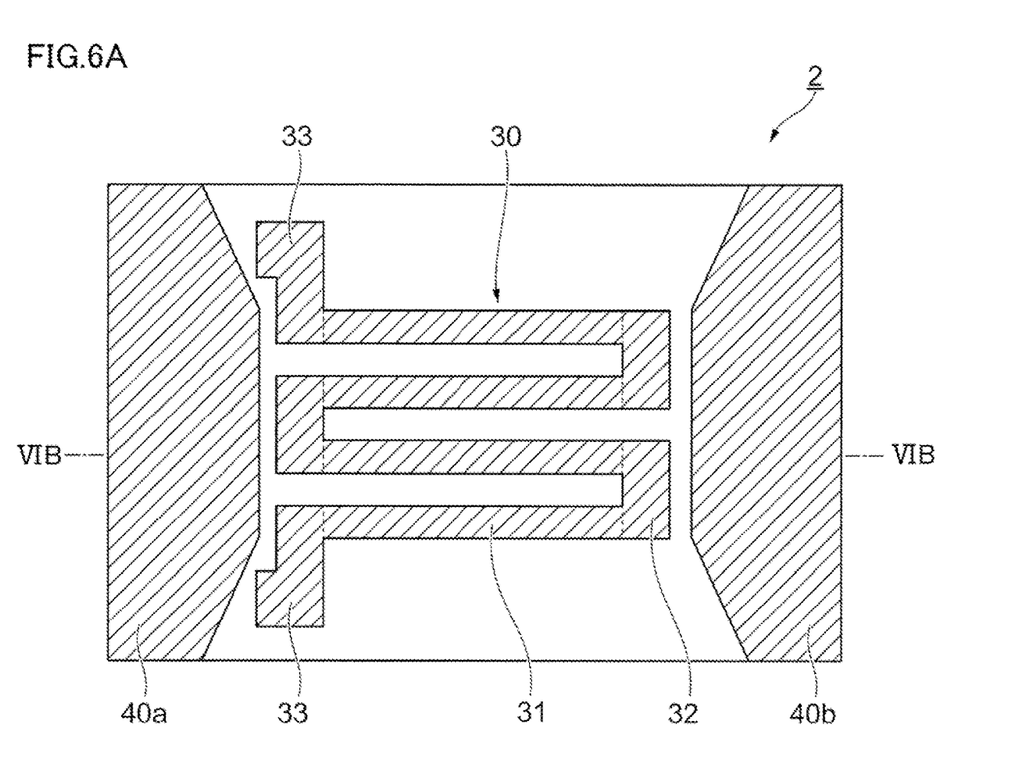
FIGS. 6A and 6B illustrate an example of a magnetic sensor in accordance with a second embodiment.
Figure 6B:
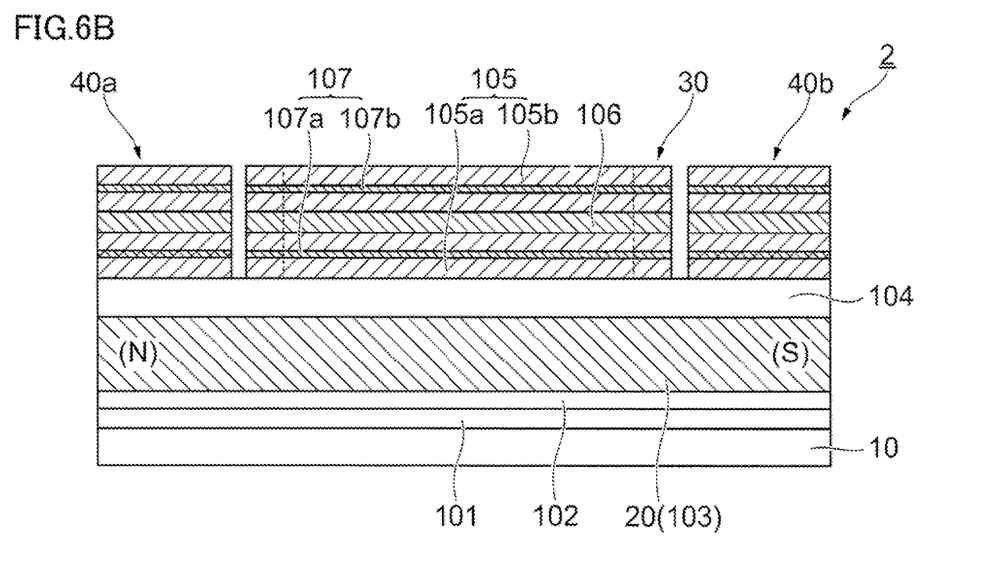

Now a description will be given of a second embodiment of the present invention. FIGS. 6A and 6B illustrate an example of a magnetic sensor 2 in accordance with the second embodiment; FIG. 6A is a plan view, and FIG. 6B is a sectional view taken along a line VIB-VIB in FIG. 6A. Similar components to those of the magnetic sensor 1 shown in FIGS. 1A and 1B are denoted by the same reference numerals, and detailed description thereof has been omitted.

The sensitive part 30 and the yokes 40 of the magnetic sensor 2 of the second embodiment include the soft magnetic layers 105 (lower soft magnetic layer 105a and upper soft magnetic layer 105b) and the conductor layer 106, similarly to the magnetic sensor 1 of the first embodiment.

The magnetic sensor 2 of the second embodiment further includes demagnetizing field suppressing layers 107 (lower demagnetizing field suppressing layer 107a and upper demagnetizing field suppressing layer 107b) respectively at the center in the thickness direction of the lower soft magnetic layer 105a and the upper soft magnetic layer 105b. Specifically, in the magnetic sensor 2, the lower soft magnetic layer 105a is divided in the thickness direction by the lower demagnetizing field suppressing layer 107a. Likewise, in the magnetic sensor 2, the upper soft magnetic layer 105b is divided in the thickness direction by the upper demagnetizing field suppressing layer 107b. In the following description, the two demagnetizing field suppressing layers 107 (lower demagnetizing field suppressing layer 107a and upper demagnetizing field suppressing layer 107b) are simply referred to as demagnetizing field suppressing layers 107 unless their distinction is particularly needed.

The demagnetizing field suppressing layers 107 are composed of Ru or an Ru alloy. Here, a film thickness of each of the demagnetizing field suppressing layers 107 (lower demagnetizing field suppressing layer 107a and upper demagnetizing field suppressing layer 107b) made of Ru or an Ru alloy is set in the range of 0.4 nm to 1.0 nm or in the range of 1.6 nm to 2.6 nm. This gives an antiferromagnetically coupled (AFC) structure to the lower soft magnetic layer 105a and the upper soft magnetic layer 105b respectively divided by the demagnetizing field suppressing layers 107 (lower demagnetizing field suppressing layer 107a and upper demagnetizing field suppressing layer 107b). As a result, this reduces the demagnetization field and improves the sensitivity of the sensitive element 31.

Similarly to the magnetic sensor 1 of the first embodiment, the sensitive part 30 (sensitive element 31) of the magnetic sensor 2 of the second embodiment includes the conductor layer 106, which reduces the resistance R of the sensitive element 31 as compared to the case where the sensitive part 30 does not include the conductor layer 106. Hence, the magnetic sensor 2 avoids a decrease in the amount of change $\Delta Z$ of the impedance Z as a function of the amount of change $\Delta H$ of the magnetic field H ($\Delta Z/\Delta H$) even when electric current supplied to the sensitive element 31 has a high frequency (e.g., 100 MHz or more).

Third Embodiment

Figure 7A:
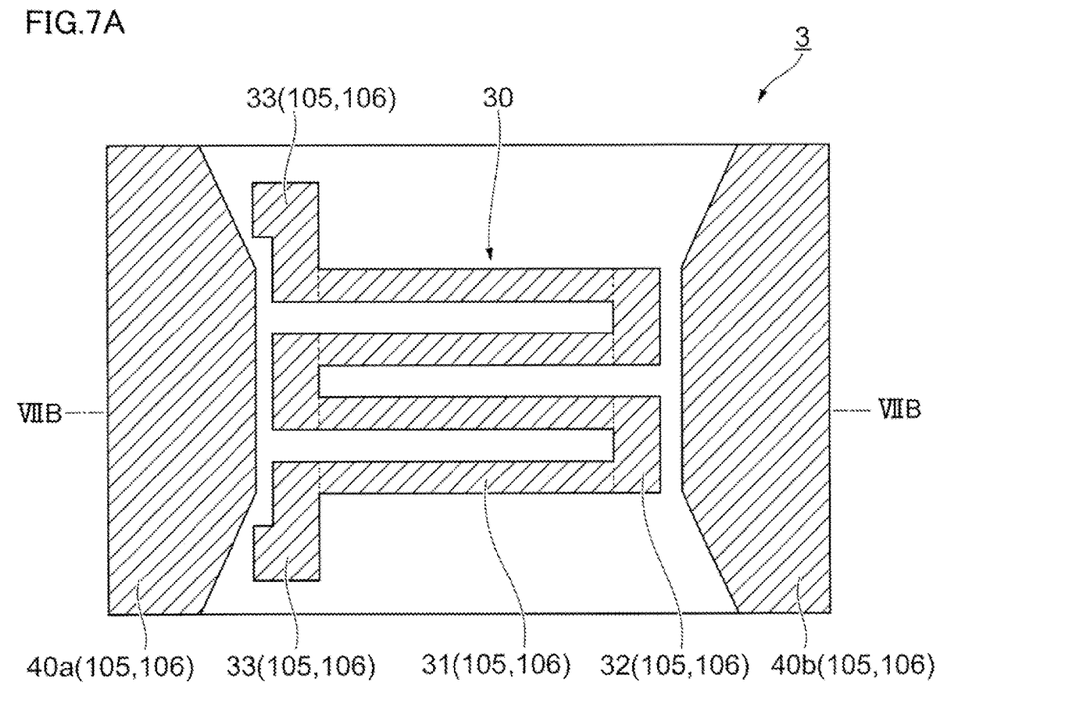
FIGS. 7A and 7B illustrate an example of a magnetic sensor in accordance with a third embodiment.
Figure 7B:
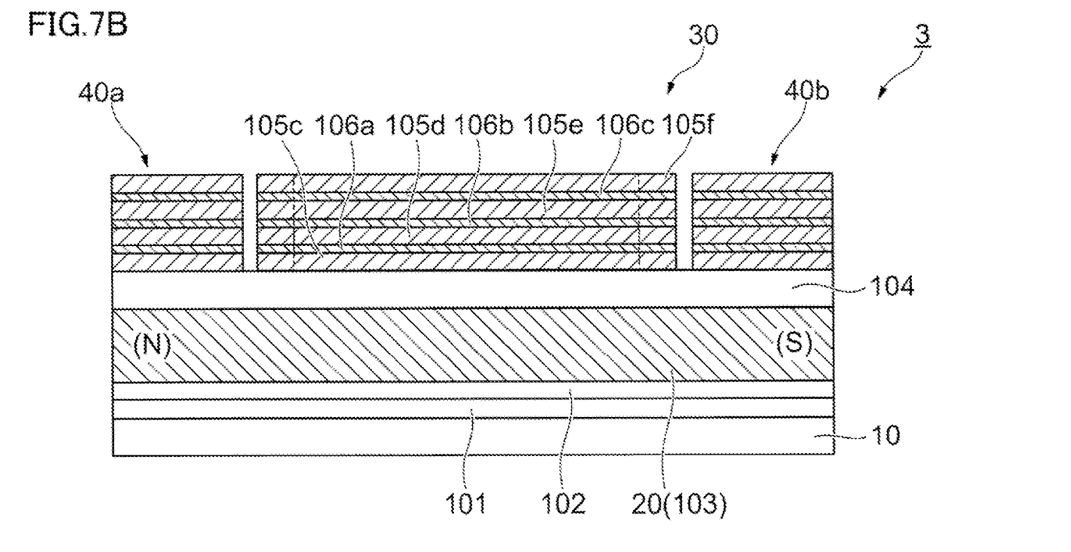

Now a description will be given of a third embodiment of the present invention. FIGS. 7A and 7B illustrate an example of a magnetic sensor 3 in accordance with the third embodiment; FIG. 7A is a plan view, and FIG. 7B is a sectional view taken along a line VIIB-VIIB in FIG. 7A. Similar components to those of the magnetic sensor 1 shown in FIGS. 1A and 1B are denoted by the same reference numerals, and detailed description thereof has been omitted.

The sensitive part 30 and the yokes 40 of the magnetic sensor 3 of the third embodiment include four soft magnetic layers 105 (a first soft magnetic layer 105c, a second soft magnetic layer 105d, a third soft magnetic layer 105e, and a fourth soft magnetic layer 105f) and three conductor layers 106 (a first conductor layer 106a, a second conductor layer 106b, and a third conductor layer 106c). Specifically, each of the sensitive part 30 and the yokes 40 of the magnetic sensor 3 is composed of the first soft magnetic layer 105c, the first conductor layer 106a, the second soft magnetic layer 105d, the second conductor layer 106b, the third soft magnetic layer 105e, the third conductor layer 106c, and the fourth soft magnetic layer 105f laminated in this order.

In the following description, the four soft magnetic layers 105 (the first soft magnetic layer 105c, the second soft magnetic layer 105d, the third soft magnetic layer 105e, and the fourth soft magnetic layer 105f) are simply referred to as soft magnetic layers 105 unless their distinction is particularly needed. Likewise, the three conductor layers 106 (the first conductor layer 106a, the second conductor layer 106b, and the third conductor layer 106c) are simply referred to as conductor layers 106 unless their distinction is particularly needed.

Similarly to the magnetic sensor 1 of the first embodiment, the sensitive part 30 (sensitive element 31) of the magnetic sensor 3 of the third embodiment includes the conductor layers 106, which reduces the resistance R of the sensitive element 31 as compared to the case where the sensitive part 30 does not include the conductor layer 106. Hence, the magnetic sensor 3 avoids a decrease in the amount of change $\Delta Z$ of the impedance Z as a function of the amount of change $\Delta H$ of the magnetic field H ($\Delta Z/\Delta H$) even when electric current supplied to the sensitive element 31 has a high frequency (e.g., 100 MHz or more).

It should be noted that there is no particular limitation on the number of soft magnetic layers 105 and the number of conductor layers 106 in the magnetic sensor 3 of the third embodiment. That is, there may be five or more soft magnetic layers 105 and four or more conductor layers 106 as long as the uppermost and lowermost layers of the sensitive part 30 are the soft magnetic layers 105.

While the exemplary embodiments of the present invention have been described above, the present invention is not limited to the above exemplary embodiments. Various modifications and combinations of embodiments may be made without departing from the spirit of the present invention.

REFERENCE SIGNS LIST 1, 2, 3 Magnetic sensor
10 Substrate
20 Thin-film magnet
30 Sensitive part
31 Sensitive element
32 Connecting portion
33 Terminal portion
40, 40a, 40b Yoke
101 Adhesive layer
102 Control layer
103 Hard magnetic layer
104 Insulating layer
105 Soft magnetic layer
106 Conductor layer
107 Demagnetizing field suppressing layer

The invention claimed is:

1. A magnetic sensor comprising:
a nonmagnetic substrate;
a sensitive element including a plurality of soft magnetic layers laminated on or above the nonmagnetic substrate and a conductor layer laminated between the plurality of soft magnetic layers, the conductor layer having higher conductivity than the plurality of soft magnetic layers, the sensitive element having a longitudinal direction and a transverse direction and having uniaxial magnetic anisotropy in a direction intersecting the longitudinal direction, the sensitive element being configured to sense a magnetic field by a magnetic impedance effect; and
a pair of flat-shaped yokes formed on a same plane as the sensitive element such that the pair of yokes face respective ends in the longitudinal direction of the sensitive element,
wherein each of the pair of yokes includes the plurality of soft magnetic layers and the conductor layer laminated between the plurality of soft magnetic layers.

2. The magnetic sensor according to claim 1, wherein each of the plurality of soft magnetic layers included in the sensitive element has an antiferromagnetically coupled structure that is provided by a demagnetizing field suppressing layer composed of Ru or an Ru alloy.

3. The magnetic sensor according to claim 1, wherein the sensitive element includes a plurality of the conductor layers.

4. The magnetic sensor according to claim 1, further comprising a thin-film magnet laminated between the nonmagnetic substrate and the plurality of soft magnetic layers of the sensitive element, the thin-film magnet being composed of a hard magnetic material and having magnetic anisotropy in an in-plane direction thereof, wherein
the longitudinal direction of the sensitive element is oriented in a direction of a magnetic field generated by the thin-film magnet.

5. A method for manufacturing a magnetic sensor, the method comprising:
forming a sensitive element by alternately laminating a plurality of soft magnetic layers and a conductor layer on or above a nonmagnetic substrate, the conductor layer having higher conductivity than the plurality of soft magnetic layers, the sensitive element having a longitudinal direction and a transverse direction and having uniaxial magnetic anisotropy in a direction intersecting the longitudinal direction, and
forming a pair of flat-shaped yokes formed on a same plane as the sensitive element such that the pair of yokes face respective ends in the longitudinal direction of the sensitive element,
wherein each of the pair of yokes includes the plurality of soft magnetic layers and the conductor layer laminated between the plurality of soft magnetic layers.

* * * * *